(12) United States Patent
Aromin et al.

(10) Patent No.: US 10,271,440 B2
(45) Date of Patent: Apr. 23, 2019

(54) MULTI-CHAMBER GFCI HOUSING APPARATUS

(71) Applicants: Victor V Aromin, West Warwick, RI (US); Daniel R Paquette, Woonsocket, RI (US)

(72) Inventors: Victor V Aromin, West Warwick, RI (US); Daniel R Paquette, Woonsocket, RI (US)

(73) Assignee: Tower Manufacturing Company, Providence, RI (US)

( * ) Notice: Subject to any disclaimer, the term of this patent is extended or adjusted under 35 U.S.C. 154(b) by 0 days.

(21) Appl. No.: 15/954,510

(22) Filed: Apr. 16, 2018

(65) Prior Publication Data

US 2018/0302997 A1 Oct. 18, 2018

Related U.S. Application Data

(60) Provisional application No. 62/485,961, filed on Apr. 16, 2017.

(51) Int. Cl.
| | |
|---|---|
| *H05K 5/00* | (2006.01) |
| *H05K 5/02* | (2006.01) |
| *H01R 12/53* | (2011.01) |
| *H01R 13/52* | (2006.01) |
| *H01R 13/713* | (2006.01) |
| *H02H 3/16* | (2006.01) |
| *H01R 24/30* | (2011.01) |

(52) U.S. Cl.
CPC ........... *H05K 5/0052* (2013.01); *H01R 12/53* (2013.01); *H01R 13/5202* (2013.01); *H05K 5/0217* (2013.01); *H05K 5/0247* (2013.01); *H01R 13/7135* (2013.01); *H01R 24/30* (2013.01); *H02H 3/16* (2013.01)

(58) Field of Classification Search
CPC .................................................. H01R 13/7135
See application file for complete search history.

(56) References Cited

U.S. PATENT DOCUMENTS

| | | | | |
|---|---|---|---|---|
| 5,148,344 | A * | 9/1992 | Rao | H01H 83/04 361/115 |
| 5,862,029 | A * | 1/1999 | Nicol | H01H 83/02 361/115 |
| 6,122,155 | A * | 9/2000 | Aromin | H02H 3/338 361/42 |
| 65,923,933 | | 7/2003 | Gentle | |
| 7,423,854 | B2 * | 9/2008 | Gandolfi | H02H 3/14 361/42 |
| 8,049,122 | B2 | 11/2011 | Watford | |
| 8,390,404 | B2 * | 3/2013 | Zou | H01R 13/7135 335/18 |

(Continued)

*Primary Examiner* — Hung V Ngo

(57) ABSTRACT

In accordance with one embodiment of the present invention a multi-chamber GFCI housing apparatus is provided. The multi-chamber GFCI housing includes a printed circuit board (PCB) chamber and an isolated cable chamber; each chamber is independently accessible and water resistant. In addition, the relative volumes, of each independent chamber permit sufficient housing volume to allow for sufficient spacing between electrical GFCI components and electrical PCB traces to prevent the risk of arcing between the components while also adhering to constrained dimensions according to electrical codes and standards.

11 Claims, 16 Drawing Sheets

(56) References Cited

U.S. PATENT DOCUMENTS

| | | | |
|---|---|---|---|
| 8,824,110 B2* | 9/2014 | Zou | H02H 3/06 361/42 |
| 9,466,971 B2* | 10/2016 | Aromin | H02H 3/33 |
| 2012/0052702 A1* | 3/2012 | Zou | H01R 13/7135 439/95 |
| 2014/0139955 A1* | 5/2014 | Ye | H01R 13/7135 361/42 |
| 2016/0233660 A1 | 8/2016 | Snagel | |

* cited by examiner

MULTI-CHAMBER GFCI HOUSING APPARATUS

CROSS-REFERENCE TO RELATED APPLICATIONS

The present application is related to, claims the earliest available effective filing date(s) from (e.g., claims earliest available priority dates for other than provisional patent applications; claims benefits under 35 USC § 119(e) for provisional patent applications), and incorporates by reference in its entirety all subject matter of the following listed application(s) (the "Related Applications") to the extent such subject matter is not inconsistent herewith; the present application also claims the earliest available effective filing date(s) from, and also incorporates by reference in its entirety all subject matter of any and all parent, grandparent, great-grandparent, etc. applications of the Related Application(s) to the extent such subject matter is not inconsistent herewith:

U.S. provisional patent application 62/485,961, entitled "Multi Chamber GFCI Housing Apparatus", naming Victor V. Aromin as first inventor, filed 16 Apr. 2017.

FIELD OF USE

The present invention relates generally to ground fault safety devices and more specifically to circuit interrupter enclosures.

DESCRIPTION OF PRIOR ART (BACKGROUND)

It is well known for electrical appliances, such as hair dryers, to draw electrical power through connection to a power source, such as an electrical outlet. Specifically, the electrical appliance (which serves as the load of the electrical system) is connected to the power source by a pair of current-carrying wires. The pair of current-carrying wires typically include a hot wire and a neutral wire, the pair of wires having equal but opposite magnitudes under normal conditions.

On occasion, the electrical system may experience a ground fault condition while the load is connected to the power supply. A ground fault condition occurs when the differential between the values of the currents of the two wires exceeds a predetermined value. Often a ground fault will occur if the hot line becomes inadvertently grounded. A ground fault condition can result in a loss of power to the electrical appliance because current is unable to flow to the load. As a consequence, an excessive amount of current tends to flow into the ground conductor of the electrical system which, in turn, creates dangerous voltage levels at points in the circuit that should be at ground potential. This condition can result in potentially dangerous electrical shocks, which could seriously injure an individual.

Accordingly, ground fault safety devices are commonly employed in such electrical systems to eliminate ground fault conditions. One type of ground fault safety device is the ground fault circuit interrupter (GFCI). Another type of ground fault safety device is the appliance leakage current interrupter (ALCI). Ground fault circuit interrupters are used to eliminate ground fault conditions as well as grounded neutral conditions, whereas appliance leakage current interrupter are used only to eliminate ground fault conditions.

Both types of ground fault safety devices prevent ground fault conditions from occurring by opening the electric circuit upon the detection of a ground fault condition in the pair of wires. It is known to incorporate GFCI's and ALCI's into electrical plugs, electrical switches and electrical receptacles.

GFCIs and ALCIs are commonly mounted within a generally rectangular housing having a top, a bottom, a front end and a rear end. The housing is attached to the appliance by an electrical cord which extends into the housing from the rear end. A pair of prongs (blades) typically extend out from the housing and are sized, shaped and spaced away from each other so that they can be inserted into the sockets of an electrical outlet, thus making contact and closing the circuit.

The electrical cord is connected inside the housing to a terminal block. Access to the terminal block often requires that the housing be disassembled to reveal the terminal block connections. However, disassembly of the housing usually exposes the GFCI or ALCI circuitry to potential damage which may not be discovered until operation, leading to potentially catastrophic damage and/or injury.

Furthermore, components used to build the GFCI and ALCI circuits include discrete components (e.g., diodes, resistors, capacitors, etc), printed circuit boards (PCBs), solenoids, and relays. The relative location of these components, including electrical PCB traces, is critical to prevent electrical arcing between the components. Thus, there must be sufficient housing volume to allow for sufficient spacing between components and electrical PCB traces to prevent the risk of arcing between the components. However, the housing enclosing the circuits and the terminal block is constrained in certain dimensions according to electrical codes and standards.

Furthermore, the GFCI and/or ALCI circuits are susceptible to moisture damage. Consequently, there exists a need to prevent or retard moisture seepage into the circuit area. Where the terminal block and the circuitry share a common space, as in the prior art, moisture seepage into the common space may cause unknown circuitry damage to the GFCI tripping circuit and/or hardware leading to potentially catastrophic damage and/or injury.

Similarly, circuit breakers with ground fault or arc fault systems typically include a self-test button. These button designs usually include a mechanical spring, a secondary contact, and a hard-plastic Push to Test (PTT) button. The test button is typically biased by a mechanical force provided by the spring. As the test button is depressed, the mechanical spring makes contact with a secondary contact. The secondary contact can be made of a similar material as the mechanical spring and may have spring type properties, or the secondary contact may be a stationary pin mounted on a printed circuit board (PCB).

One disadvantage is that a gap between the test button and a housing of the circuit breaker is present before or during when the button is depressed. When the gap between the button and the housing is present, several concerns arise related to moisture, corrosion, and potential electric shock. With the gap present, internal components are exposed to outside moisture and/or other containments that could disable the tripping functions of the test button. Although PCB's are typically conformal coated, this does not guarantee that moisture could not damage the PCB and/or related electrical components and disable the push to test button and/or present the possibility of the a user being exposed to electrical shock.

BRIEF SUMMARY

The foregoing and other problems are overcome, and other advantages are realized, in accordance with the presently preferred embodiments of these teachings.

In accordance with one embodiment of the present invention an electronic circuit (EC) housing is provided. The EC housing includes a printed circuit board (PCB) chamber and a cable chamber isolated from the PCB chamber. The overall length of the electronic circuit housing is less than or equal to 3.95 inches, and the volume of the PCB chamber is substantially equal to 9.25 cubic inches. The internal volume of the cable chamber is substantially equal to 7.35 cubic inches, and the ratio of the PCB chamber volume to the cable chamber volume is substantially constant at 1.26.

The invention is also directed towards a water-resistant ground fault interrupter circuit (GFCI) housing. The housing includes a top housing cover having, a length L1 and a groove circumscribing the top housing. The housing also includes a bottom housing cover mateable with the top housing cover and having a length L2, wherein L2 is substantially 2.2 inches. The bottom housing also includes a first compression ridge disposed along the top housing mating surfaces. The bottom housing cover also includes a second groove disposed along the bottom cable cover mating surface. Also included is a bottom cable cover mateable with the top housing cover and the bottom housing cover. The bottom cable cover has a length L3, wherein L3 is less than or equal to 1.75 inches. Overall, L2+L3=L1. The bottom cable cover also includes a second compression ridge disposed the top housing mating surfaces (i.e., the edge of the bottom cable cover that is mateable with the top housing). The bottom cable cover includes a third compression ridge disposed along the bottom housing mating surface.

Various other features and advantages will appear from the description to follow. In the description, reference is made to the accompanying drawings which form a part thereof, and in which is shown by way of illustration, specific embodiments for practicing the invention. These embodiments will be described in sufficient detail to enable those skilled in the art to practice the invention, and it is to be understood that other embodiments may be utilized and that structural changes may be made without departing from the scope of the invention. The following detailed description is therefore, not to be taken in a limiting sense.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a non-exclusive example: and If the specification states a component or feature "may," "can," "could," "should," "preferably," "possibly," "typically," "optionally," "for example," or "might" (or other such language) be included or have a characteristic, that particular component or feature is not required to be included or to have the characteristic.

Figure 1:
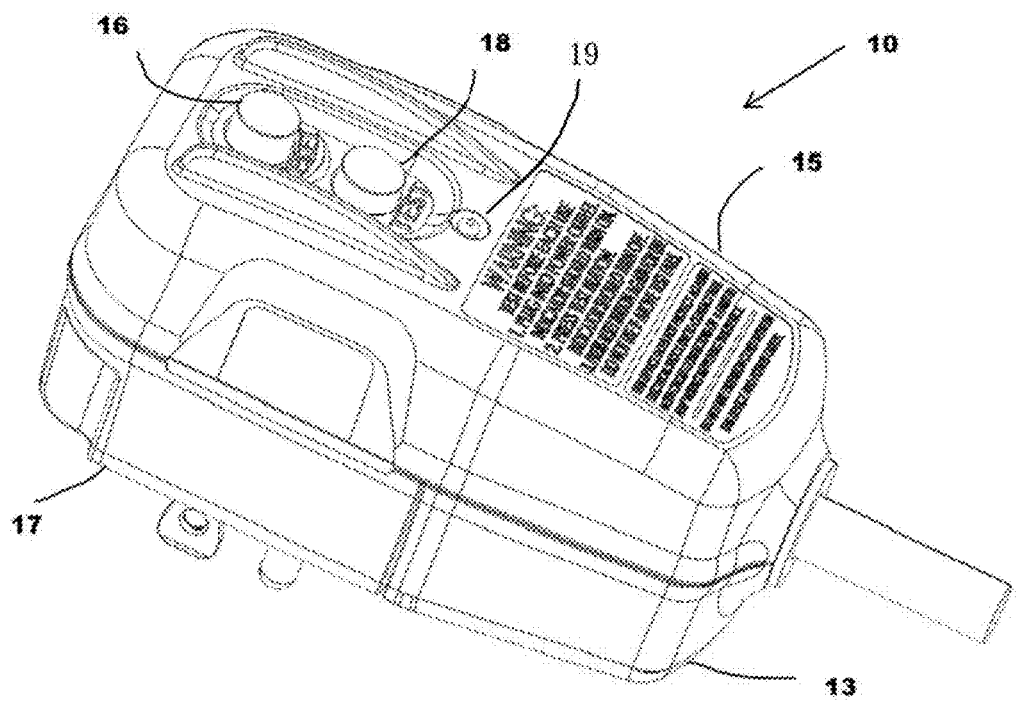
FIG. 1 is a perspective view of a GFCI housing according to this invention.

Referring now to FIG. 1 there is shown is a perspective view of a circuit housing 10 according to this invention. Circuit housing 10 includes bottom PCB housing 17, bottom cable cover 13, and a top housing 15. Also, shown in FIG. 1 are water intrusion barrier button caps 16 and 18 and trip indication lens 19. GFCI housing 10 can be made from any suitable fire retardant material having material properties with flame ratings in accordance with Underwriters Laboratories (UL) 94, the Standard for Safety of Flammability of Plastic Materials for Parts in Devices and Appliances. In one embodiment, suitable materials such as thermoplastic polyester resins based on polybutylene terephthalate (PBT) and/or polyethylene terephthalate (PET) polymers may be used.

Figure 1B:
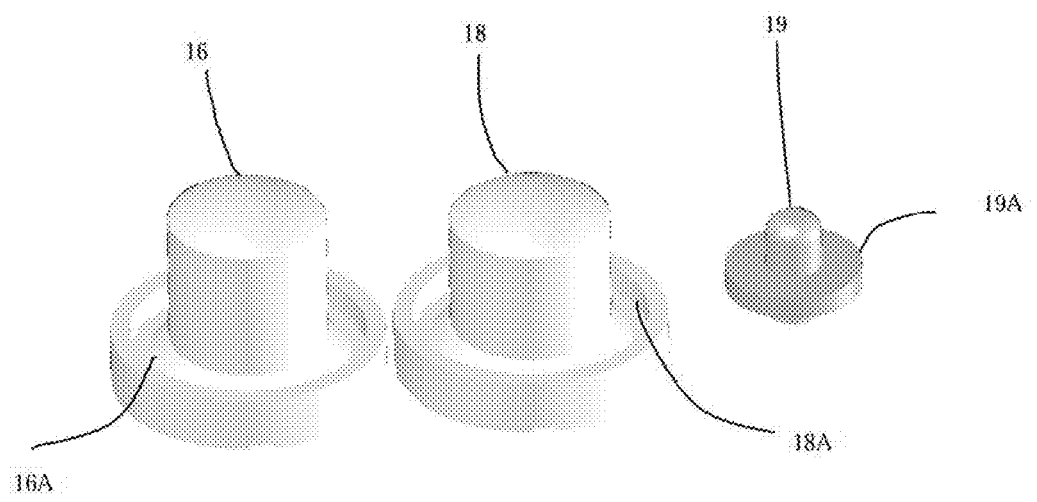
FIG. 1B is a perspective view of test, reset water intrusion barrier button caps and indicator lens and watertight ring.

Referring also to FIG. 1B there is shown a perspective view of test, reset water intrusion barrier button caps 16 and 18 and indicator lens 19 and watertight ring 19A. Water intrusion barrier caps 16 and 18 are flexible circular shaped membrane for fitting over a PTT button (not shown) and projecting through openings 16O and 18O, respectively (see FIG. 4). Barrier caps 16 and 18 include grooved circular channels 16A, 18A, configured to mate with circular shoulders on the underside of top housing 15 (see FIG. 5) to form a water-resistant seal to exclude moisture and contaminants from the housing at the openings 16O and 18O.

Still referring to FIG. 1B, there is shown watertight ring 19A. Watertight ring 19A fits snugly over lens 19 and mates with top housing 15 to form a water-resistant seal to exclude moisture and contaminants from the housing at the opening 19O.

Figure 2:
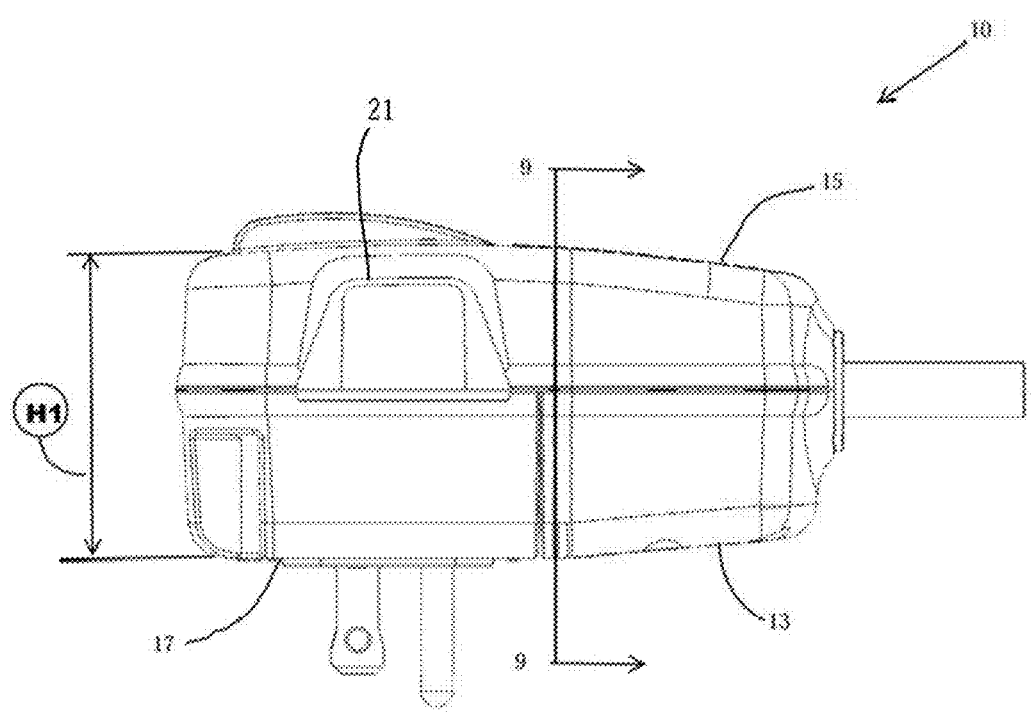
FIG. 2 is a side view of circuit housing shown in FIG. 1.

Referring also to FIG. 2 there is shown a side view of circuit housing 10 shown in FIG. 1. Shown in FIG. 2 is grasp ledge 21 adapted to provide a hand or finger grasping area (see FIG. 15: 21A) and leverage for plugging and unplugging circuit housing 10. Also, referenced in FIG. 2 is height H1. H1 is used in subsequent formulas for determining overall enclosed volume of circuit housing 10.

Figure 3:
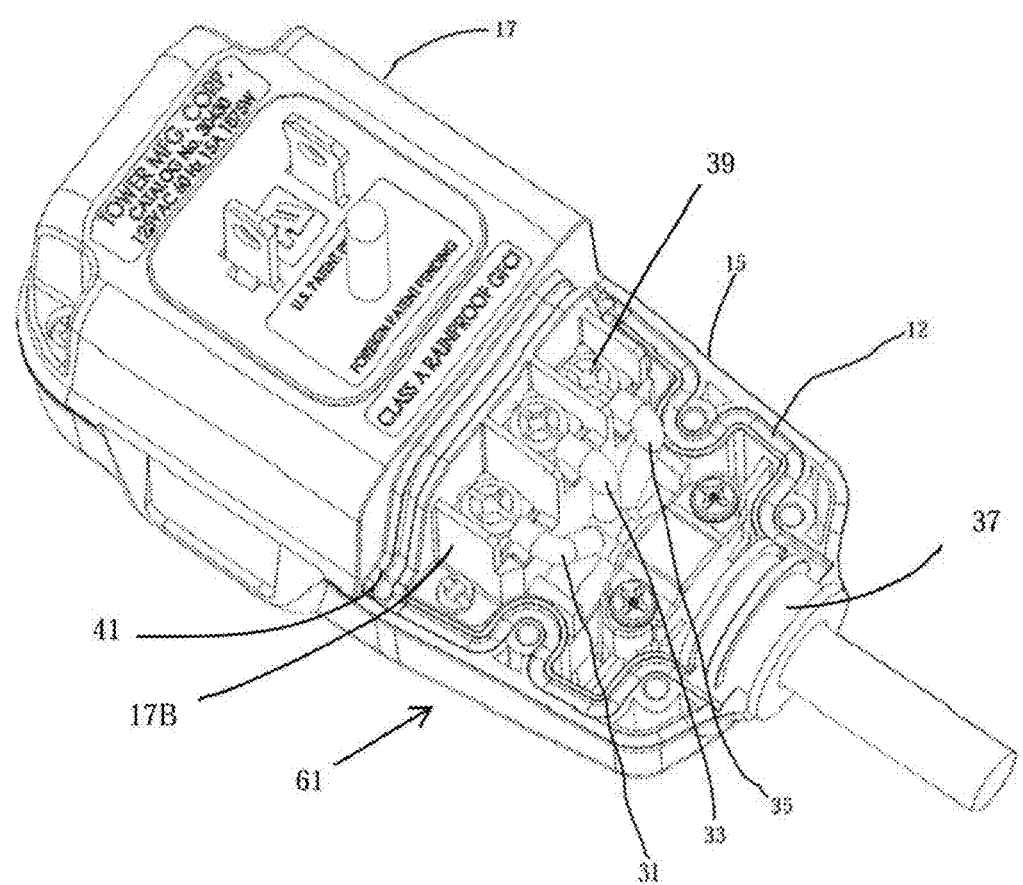
FIG. 3 is a bottom view of a partially disassembled circuit housing shown in FIG. 1.

Referring also to FIG. 3 there is shown a bottom view of a partially disassembled circuit housing 10 shown in FIG. 1. Shown in FIG. 3 is, cable chamber 61; electric wires or cables 31, 33, and 35 for conducting electricity and providing an electrical ground path. Also, shown in FIG. 3 is terminal block 17B. It will be appreciated that terminal block 17B and PCB housing 17 are one piece. Terminal block 17B provides connection 39 (only one connection is shown) for electric wires, e.g., wire 35.

Still referring to FIG. 3 there is shown a portion of the compressible gasket 12. Compressible gasket 12 may be any suitable compressible material; such as, for example, natural rubber, silicon rubber, urethane rubber, latex, neoprene, and other similar materials.

Figure 4:
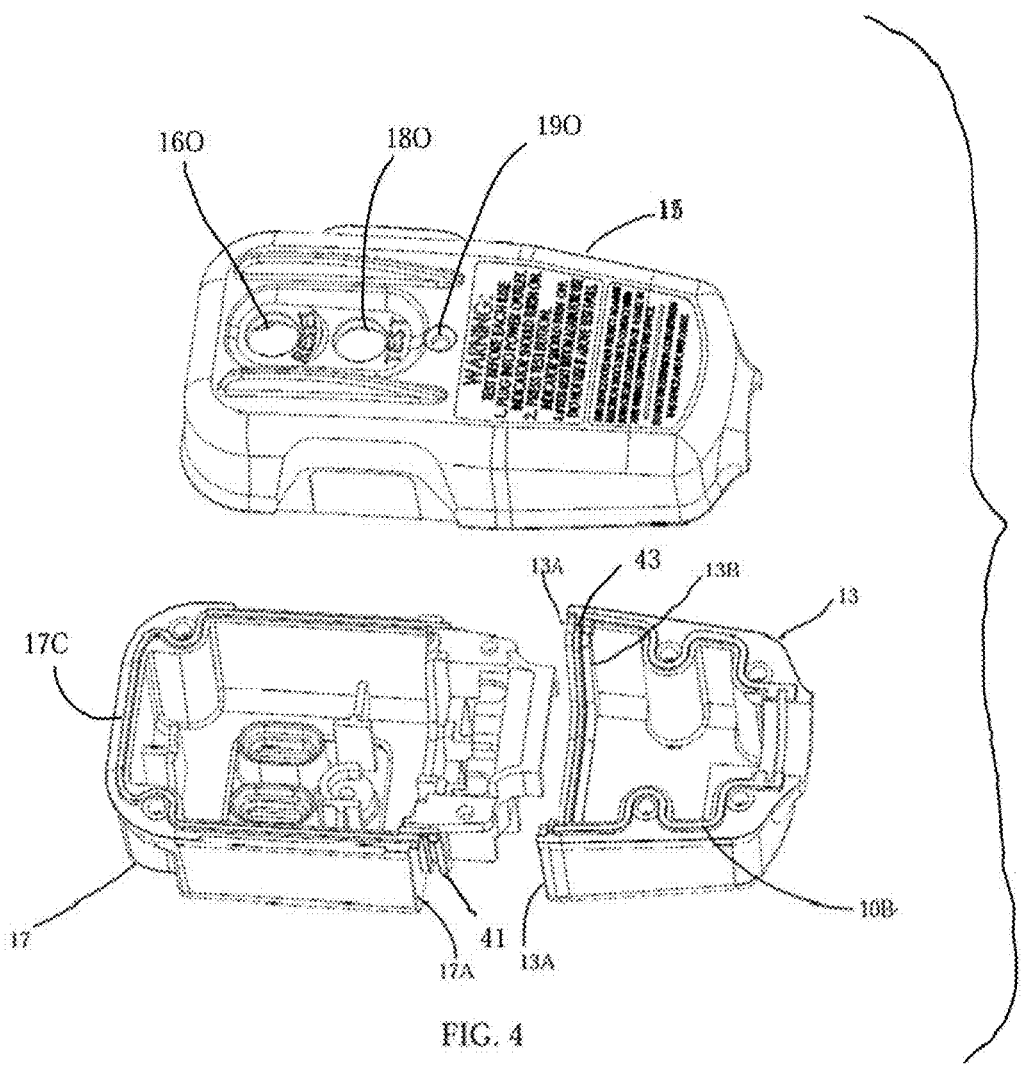
FIG. 4 is an exploded top perspective view of the circuit housing shown in FIG. 1.

Referring also to FIG. 4 there is shown an exploded top perspective view of the circuit housing 10 shown in FIG. 1. Shown in FIG. 4 is a top view of top housing 15, reset and test openings, 16O, 18O, respectively, and lens opening 19O; the inner underside of PCB housing 17; compression ridge 17C for compressing a portion of compression gasket 12 when PCB housing 17 is mated with top housing 15, PCB housing mating face 17A for mating with cable housing mating face 13A, the inner underside of cable housing 13, cable housing compression ridge 43 for mating with PCB housing groove 41 and compressing a portion of compression gasket 12 (see FIG. 3, FIG. 5); and compression ridge 10B for compressing another portion of compression gasket 12 when the cable housing 13 is mated with top housing 15. Also, shown in FIG. 4 is ride wall 13B which demarks one side of the cable chamber (see FIG. 6, item 61).

Figure 5:
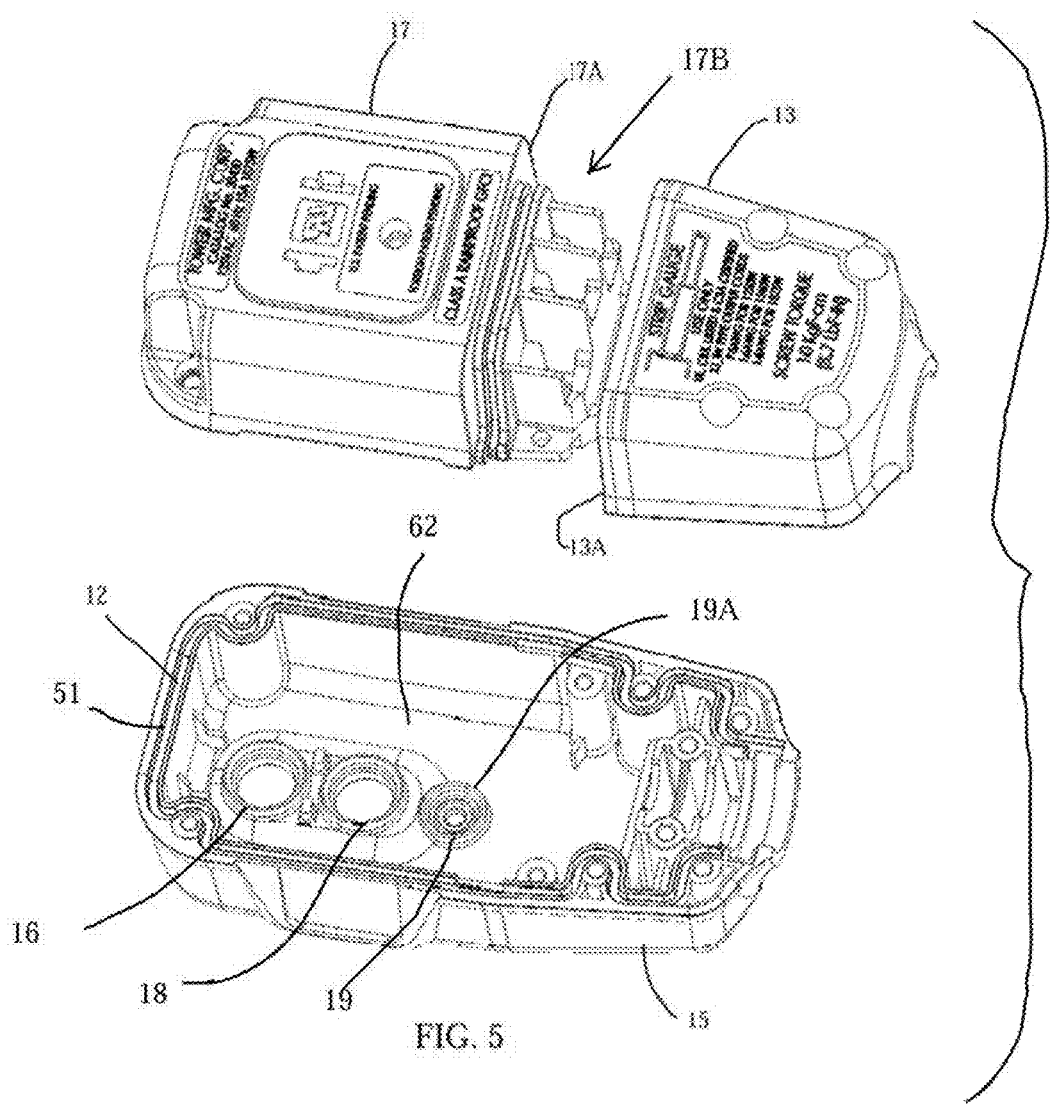
FIG. 5 is an exploded bottom perspective view of the circuit housing shown in FIG. 1.

Referring also to FIG. 5 there is shown an exploded bottom perspective view of the circuit housing 10 shown in FIG. 1. Shown in FIG. 5 is a top view of PCB housing 17, PCB housing mating face 17A for mating with cable housing mating face 13A (see FIG. 4-13A), integrated terminal block 17B (i.e., terminal block 17B is a one piece with PCB housing 17), and a top view of cable housing 13. Also, shown in FIG. 5 is perspective view of the inner underside of top housing 15; an underside view of water intrusion barrier caps 16 and 18 in place flush against the inner underside of top housing 15, and lens 19 and watertight ring 19A, flush against the inner underside 62 of top housing 15. Also shown in FIG. 5 is a portion of compression gasket 12 within top housing groove 51 circumscribing the top housing 15.

Figure 6:
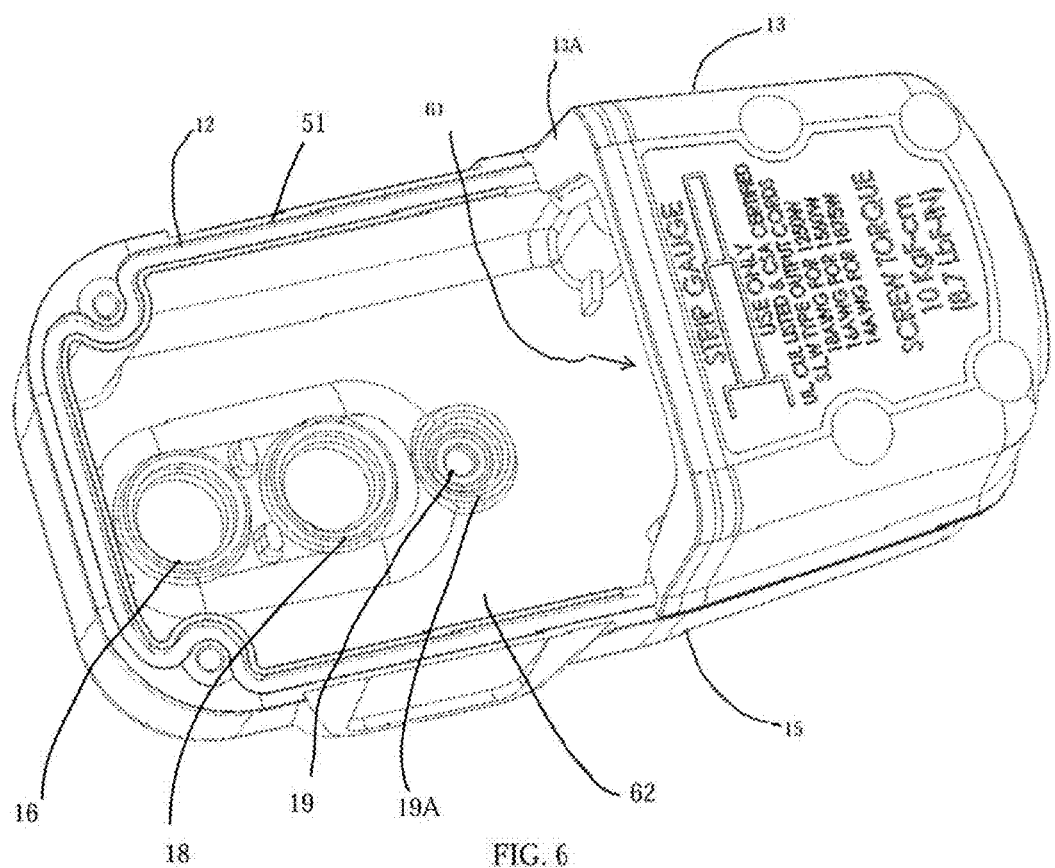
FIG. 6 is a bottom view of a partially disassembled circuit housing shown in FIG. 1.

Referring also to FIG. 6 there is shown a bottom view of a partially disassembled circuit housing 10 shown in FIG. 1. Shown in FIG. 6 is perspective view of the inner underside 62 of top housing 15; an underside view of water intrusion barrier caps 16 and 18 in place flush against the inner underside of top housing 15, and lens 19 and watertight ring 19A, flush against the inner underside 62 of top housing 15. Also, shown in FIG. 6 is cable chamber 61 formed by mating cable chamber housing 13 with top housing 15. Also, shown in FIG. 6 is a portion of compression gasket 12 within top housing groove 51 circumscribing the top housing 15.

Figure 7:
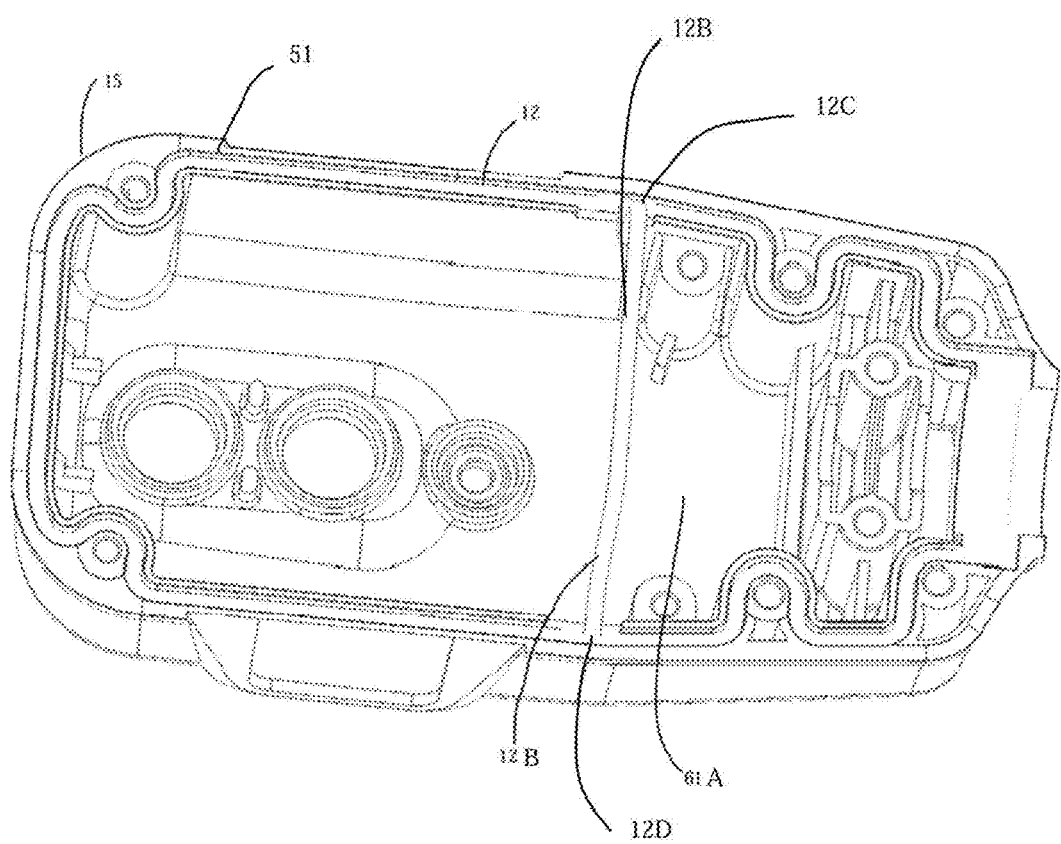
FIG. 7 is an inside illustration of the top housing shown in FIG. 1.
Figure 8:
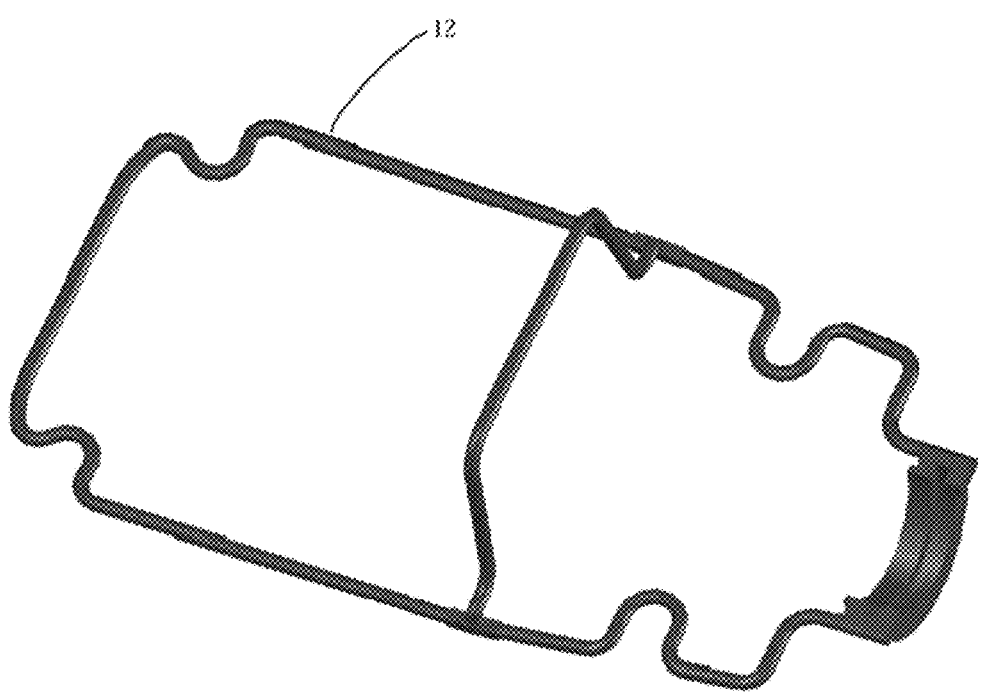
FIG. 8 is an illustration of the continuous compressible gasket shown in FIG. 7.

Referring also to FIG. 7 there is shown an inside illustration 62 of the top housing 15 shown in FIG. 1. Shown in FIG. 7 is compressible gasket 12 circumscribing top housing 15 within groove 51 circumscribing top housing 15. Also shown is transverse compressible gasket 12B, joined to compressible gasket 12 at joints 12C and 12D. It will be appreciated that compressible gasket 12 and transverse compressible gasket 12B are one piece as shown in FIG. 8. It will be understood that transverse compressible gasket 12B fits within PCB housing groove 41 (see FIG. 3 and/or FIG. 4).

Figure 9:
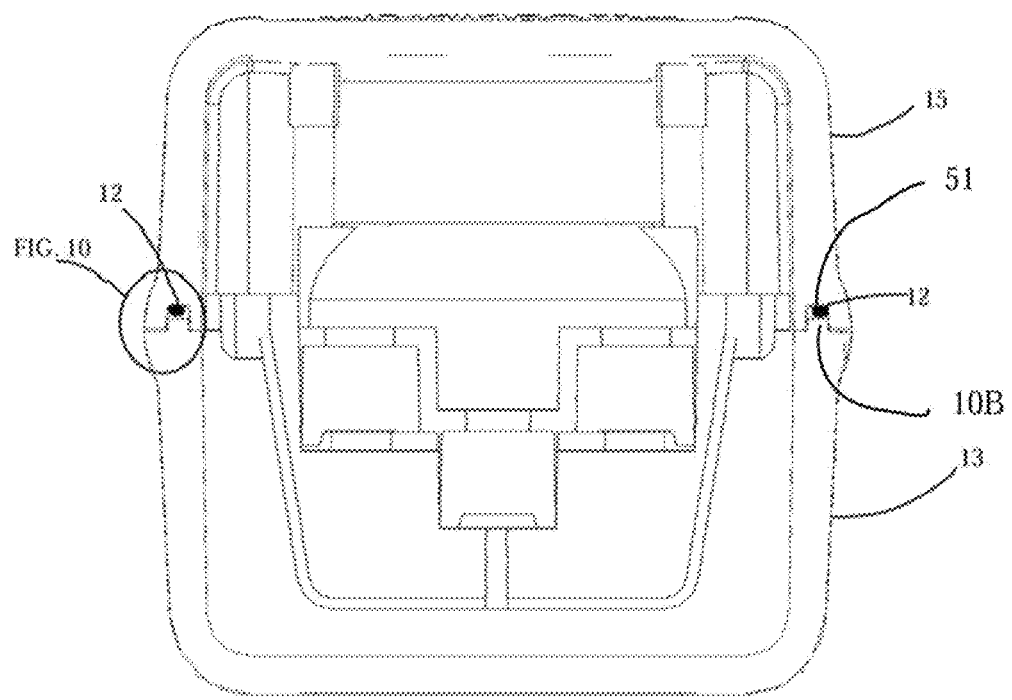
FIG. 9 is a crosscut view taken along the line 9-9 in FIG. 2.
Figure 10:
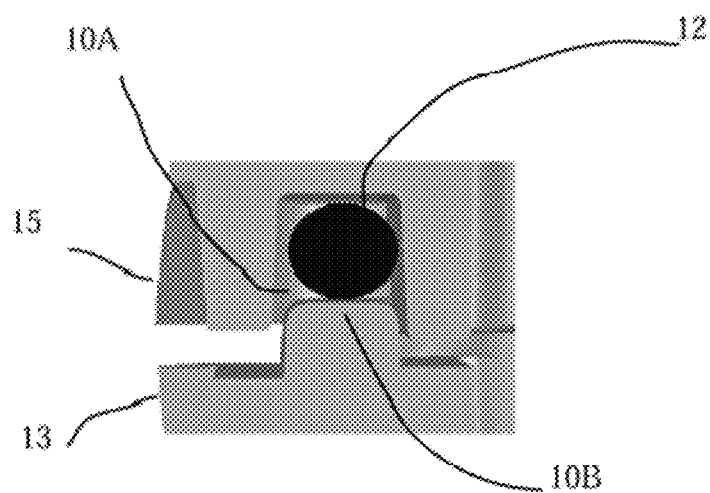
FIG. 10 is an enlarged perspective view of the compression ridge, groove, and compressible gasket shown in FIG. 9.

Referring also to FIG. 9 there is shown a crosscut view taken along the line 9-9 in FIG. 2. Shown in FIG. 9 is cable chamber housing 13 mated with top housing 15. Compressing ridge 10B compresses compression gasket 12 in channel 51 forming a water-resistant barrier. Referring also to FIG. 10 there is shown an enlarged perspective view of the compression ridge 10B, groove 51, and compressible gasket 12 shown in FIG. 9.

Figure 11:
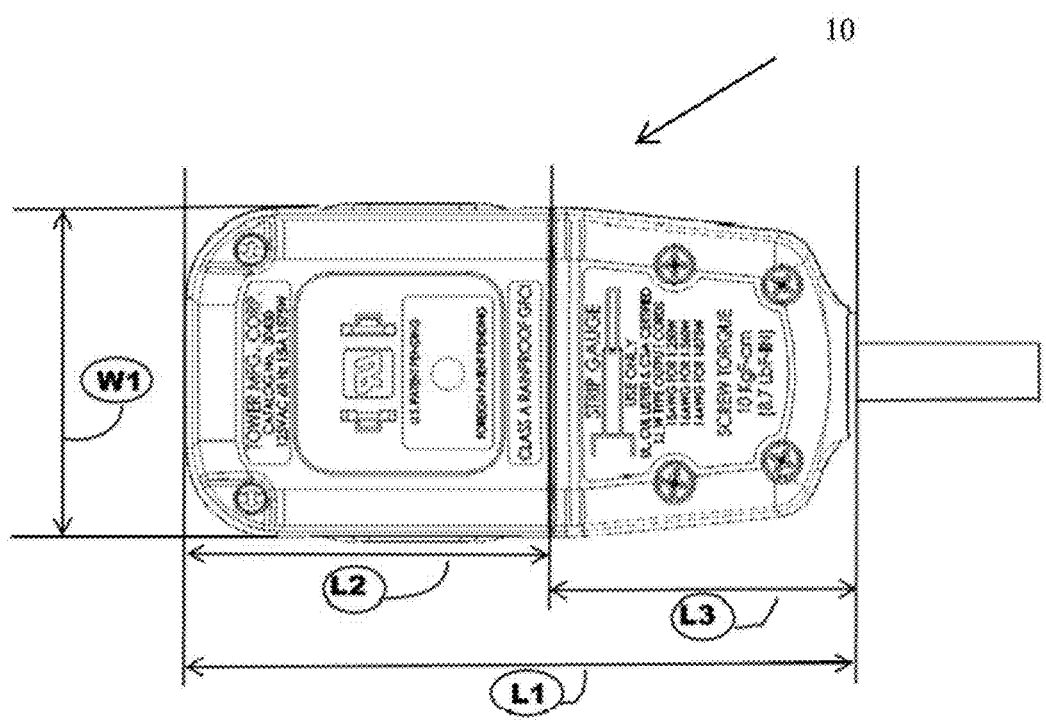
FIG. 11 is a bottom view of the housing shown in FIG. 1, and illustrates relative dimensions.

Referring also to FIG. 11 there is shown a bottom view of the housing 10 shown in FIG. 1, and illustrates relative dimensions. The overall length L1 of the electronic circuit housing 10 is less than or equal to 3.95 inches, and the volume of the PCB chamber defined by L2, W1, and H1 (shown in FIG. 2) is substantially equal to 9.25 cubic inches. The internal volume of the cable chamber (FIG. 6-6*l*) is substantially equal to 7.35 cubic inches, and the ratio of the PCB chamber volume to the cable chamber volume is substantially constant at 1.26. It will be appreciated that isolating the cable chamber from the PCB chamber and holding the volume of each chamber constant provides sufficient housing volume to allow for sufficient spacing between electrical components (not shown) and electrical PCB traces (not shown) to prevent the risk of arcing between the components while also adhering to certain constrained dimensions according to electrical codes and standards; such as, for example UL 943 Ground Fault Circuit Interrupters, and UL 840 Insulation Coordination Including Clearances and Creepage Distances for Electrical Equipment, both incorporated by reference in their entirety.

Still referring to FIG. 11, in one embodiment, the PCB housing cover 17 L2 is substantially 2.2 inches. The bottom cable cover 13 length L3, wherein L3 is less than or equal to 1.75 inches. Overall, L2+L3=L1.

Figure 12:
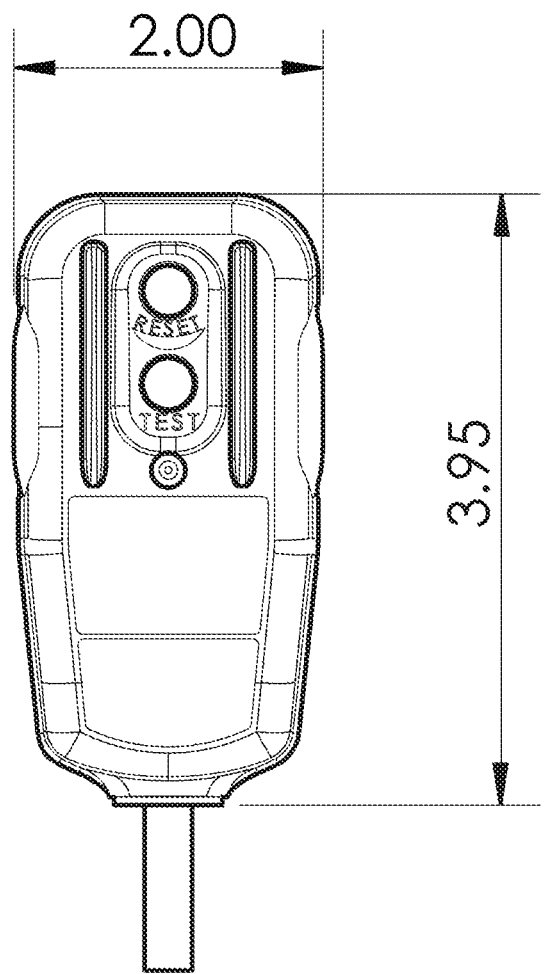
FIG. 12 is a top view of the housing shown in FIG. 1 and illustrates relative dimensions.

Referring also to FIG. 12 there is, shown a top view of the housing shown in FIG. 1. FIG. 12 illustrates relative dimensions of the width and length of the housing shown in FIG. 1.

Figure 13:
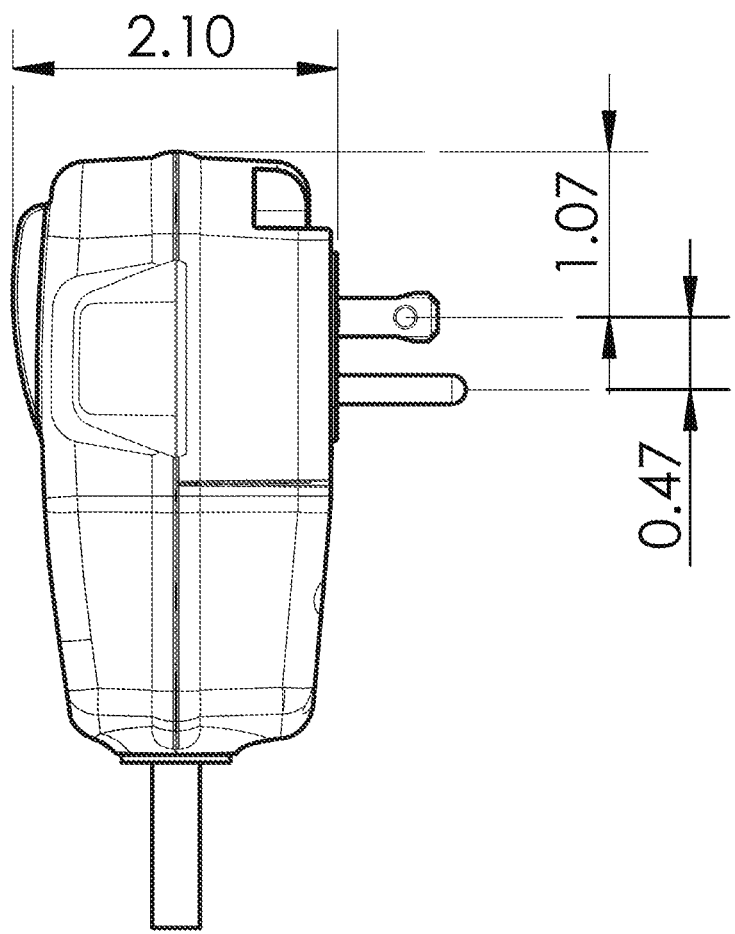
FIG. 13 is a side view of the housing shown in FIG. 1 and illustrates relative dimensions.
Figure 15:
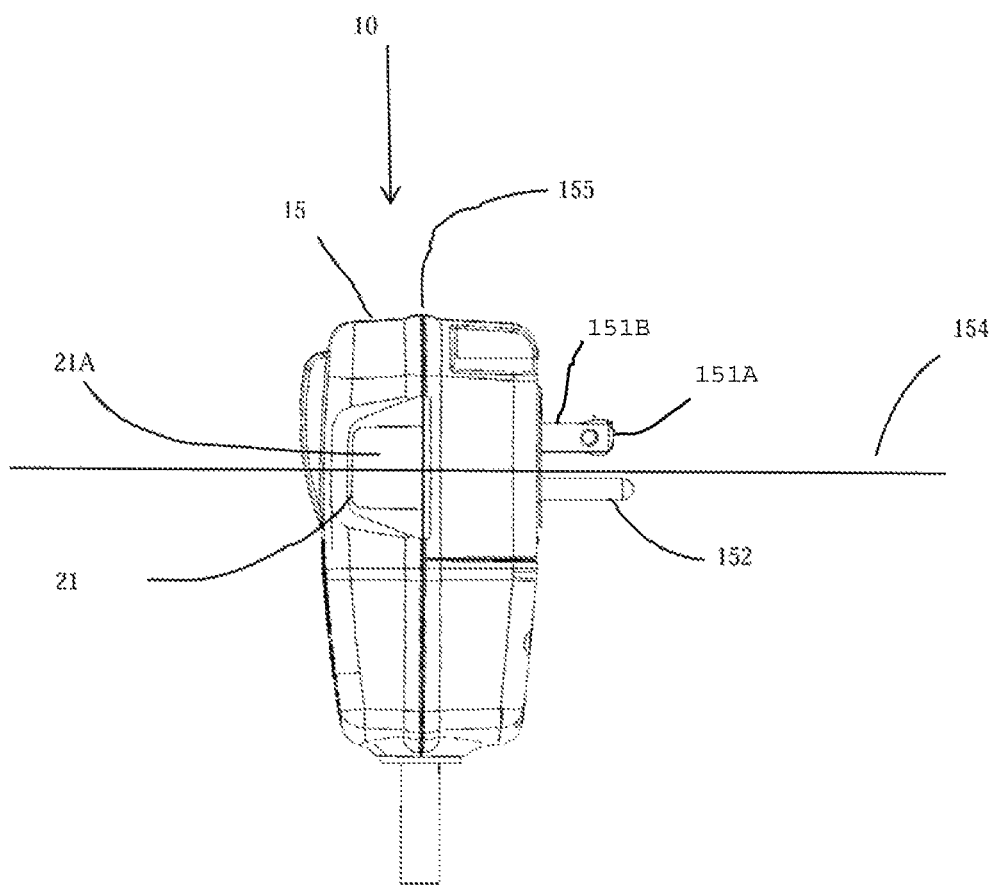
FIG. 15 is a side view of the housing shown in FIG. 1 and illustrates the alignment of the finger grip area with the contact blades and neutral pin to facilitate removal of the housing.

Referring also to FIG. 13 and FIG. 15 there is shown a side view of the housing shown in FIG. 1. FIG. 13 illustrates relative dimension of the height of the housing shown in FIG. 1. FIG. 13 also shows the relative position of the centers of the neutral and line contact blades (FIG. 15:151A, 151B) to the top of the housing (FIG. 15: 155).

Figure 14:
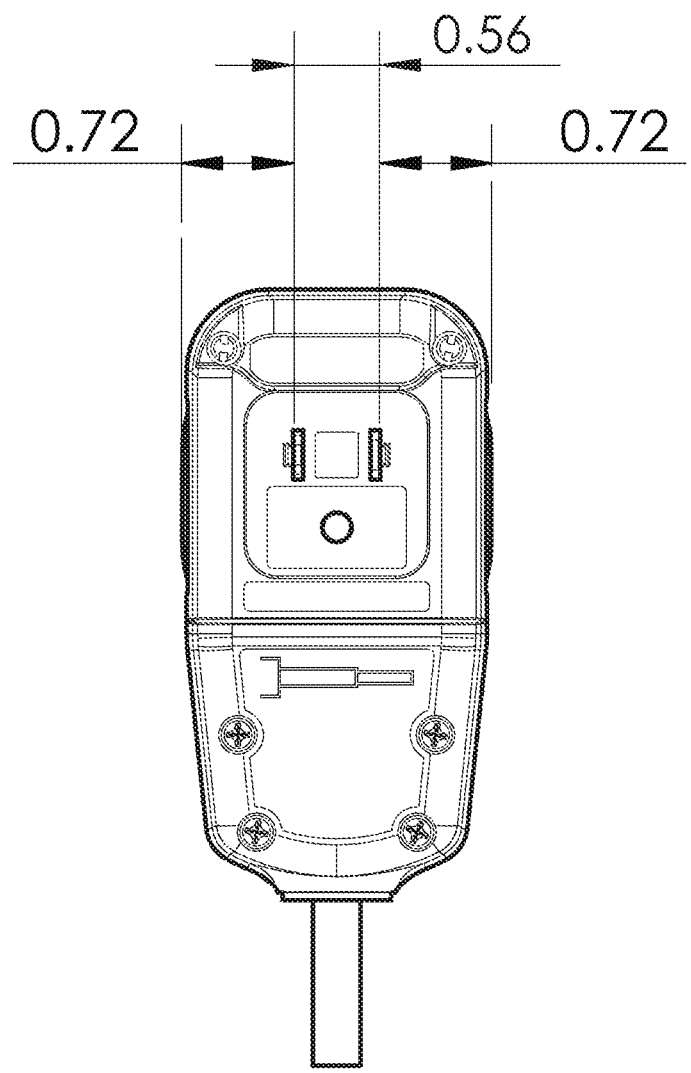
FIG. 14 is a bottom view of the housing shown in FIG. 1 and illustrates relative dimensions.

Referring also to FIG. 14 there is shown a bottom view of the housing shown in FIG. 1. FIG. 14 illustrates relative dimensions of the neutral and line contact blades to the sides of the housing shown in FIG. 1.

Referring also to FIG. 15 there shown a side view of the housing shown in FIG. 1. FIG. 15 illustrates the alignment of the finger grip ledge 21 and finger grip area 21 with the neutral contact blade 151A, line contact blade 151B and neutral pin 152 to facilitate removal of the housing 10 from a receptacle (not shown). It will be appreciated that the closer alignment of the finger grip ledge 21 and finger grip area 21 with neutral contact blade 151A, line contact blade 151B and neutral pin 152 (see alignment line 154) facilitates easier removal of the housing 10 by application of removal force nearly directly and opposite to the frictional holding forces exerted by a receptacle.

It will also be appreciated that the finger grip ledge 21 and finger grip area 21 located in the top housing 15 allows for easier accessibility and griping of the housing 10 to facilitate removal of the housing from a receptacle (not shown).

It should be understood that the foregoing description is only illustrative of the invention. Thus, various alternatives and modifications can be devised by those skilled in the art without departing from the invention. Accordingly, the present invention, is intended to embrace all such alternatives, modifications and variances that fall within the scope of the appended claims.

What is claimed is:

1. A water resistant electronic circuit (EC) housing, the EC housing, comprising:
    a printed circuit board (PCB) chamber;
    a cable chamber, wherein the cable chamber is isolated from the PCB chamber; and wherein the overall length of the electronic circuit housing is less than or equal to 3.95 inches, and wherein the volume of the PCB chamber is substantially equal to 9.25 cubic inches, and wherein the internal volume of the cable chamber is substantially equal to 7.35 cubic inches, and the ratio of the PCB chamber volume to the cable chamber volume is substantially constant at 1.26 cubic inches;
    a neutral contact blade having a center line substantially perpendicular to the EC housing, wherein the neutral contact blade is substantially 1.07 inches from the neutral contact blade center line to the face of the EC housing; and
    a top housing, wherein the top housing comprises a groove circumscribing the top housing;
    a bottom housing, wherein the bottom housing comprises a compression ridge circumscribing the bottom housing, wherein the compression ridge is mateable with the top housing groove, wherein the bottom housing comprises:
        a bottom PCB chamber housing, wherein the bottom PCB chamber housing comprises a PCB chamber housing mating face and wherein the PCB chamber housing mating face comprises a second groove;
        a bottom cable chamber cover, wherein the bottom cable chamber cover comprises a bottom chamber cover mating face and wherein the bottom chamber cover mating face comprises a second compression ridge mateable with the second groove; and
    wherein the bottom PCB chamber housing and the top housing define a water resistant PCB chamber; and
    wherein the bottom PCB chamber housing, the bottom cable chamber cover, and the top housing define a water resistant cable chamber.

2. The EC housing as in claim 1 wherein the second groove is disposed substantially between the PCB chamber and the cable chamber.

3. The EC housing as in claim 1, wherein the PCB chamber housing mating face comprises a plurality of terminal connectors.

4. The EC housing as in claim 3 wherein the plurality of terminal connectors project substantially into the cable chamber when the PCB chamber housing is mated with the top housing.

5. The EC housing as in claim 1 further comprising:
    a compressible gasket disposed within the groove circumscribing the top housing; and
    the compressible gasket disposed within the second groove.

6. A water resistant ground fault interrupter circuit (GFCI) housing comprising:
    a top housing cover comprising a length L1 and a groove circumscribing the top housing;
    a bottom PCB housing cover mateable with the top housing cover comprising:
        a length L2, wherein L2 is substantially 2.2 inches;
        a first compression ridge disposed along a top housing mating surface;
    a bottom cable cover mateable with the top housing cover and the bottom PCB housing cover comprising:
        a length L3, wherein L3 is less than or equal to 1.75 inches, wherein L2+L3=L1;
        a second compression ridge disposed along a second top housing mating surface;
    wherein the bottom PCB housing cover comprises a second groove disposed along a bottom cable cover mating surface;
    wherein the bottom cable cover comprises a third compression ridge disposed along a bottom PCB housing mating surface; and
    a neutral contact blade having a center line substantially perpendicular to the GFCI housing, wherein the neutral contact blade is substantially 1.07 inches from the neutral contact blade center line to the face of the GFCI housing.

7. The GFCI housing as in claim 6 wherein the top housing cover comprises a width W1, wherein W1 is greater than 1 inch and less than 2 inches.

8. The GFCI housing as in claim 6 wherein the bottom PCB housing cover assembled with the top housing cover comprises a GFCI circuit chamber, wherein the GFCI circuit chamber comprises a volume not less than 8.5 cubic inches.

9. The GFCI housing, as in claim 6 wherein the bottom PCB housing cover further comprises a terminal block.

10. The GFCI housing as in claim 6 wherein the bottom cable cover assembled with the top housing cover and the bottom PCB housing cover comprises a cable chamber.

11. The GFCI housing as in claim 6 further comprising a compressible gasket disposed along the groove circumscribing the top housing and the second groove disposed along the bottom cable cover mating surface.

* * * * *